United States Patent [19]

Hoehn

[11] 4,262,574
[45] Apr. 21, 1981

[54] INTEGRATED I²L CIRCUIT FOR SUPERIMPOSING AUDIO-FREQUENCY ELECTRICAL SIGNALS OF AN ELECTRONIC ORGAN

[75] Inventor: Wolfgang Hoehn, Kirchzarten, Fed. Rep. of Germany

[73] Assignee: ITT Industries, Inc., New York, N.Y.

[21] Appl. No.: 101,374

[22] Filed: Dec. 7, 1979

[30] Foreign Application Priority Data

Dec. 18, 1978 [DE] Fed. Rep. of Germany ....... 2854703

[51] Int. Cl.³ .............................................. G10H 1/18
[52] U.S. Cl. ................................ 84/1.01; 84/DIG. 7; 340/365 E
[58] Field of Search .......................... 84/1.01, DIG. 7; 340/365 E

[56] References Cited

U.S. PATENT DOCUMENTS

| | | | |
|---|---|---|---|
| 3,534,144 | 10/1970 | Ring | 84/1.01 |
| 3,816,826 | 6/1974 | Masuda et al. | 340/365 E |
| 4,229,731 | 10/1980 | Holzmann | 340/365 E |

OTHER PUBLICATIONS

Funk-Technik (1972), No. 17, pp. 630-632; No. 19, pp. 695-699; No. 20, pp. 737-739 and 781-784.
Phillips Technical Review, 33, No. 3, (1973), pp. 76-85.
1972 IEEE International Solid-State Circuits Conference Digest of Technical Papers, pp. 90-93.

*Primary Examiner*—Stanley J. Witkowski
*Attorney, Agent, or Firm*—John T. O'Halloran; Peter C. Van Der Sluys

[57] ABSTRACT

An I²L circuit for superimposing audio-frequency electrical signals in an electronic organ is provided. With each current unit of audio-frequency to be superimposed a double-collector I²L transistor is associated, and each key is coordinated to an injector, the current of which is switched by said key. In addition to the collecting bars into which said current units are fed, there is provided a separate collecting bar into which the non-audio-frequency collector currents of double collector transistors are fed, each of which being coordinated to each injector. A bounce effect is avoided by subtracting the signal of the separate collecting bar from the signals on the other collecting bars.

3 Claims, 3 Drawing Figures

INTEGRATED I²L CIRCUIT FOR SUPERIMPOSING AUDIO-FREQUENCY ELECTRICAL SIGNALS OF AN ELECTRONIC ORGAN

BACKGROUND OF THE INVENTION

1. Field of the Invention

The present invention deals with an integrated circuit for an electronic organ and, more particularly, to an I²L circuit for superimposing audiofrequency electrical signals linearly, and to obtain them at certain outputs either as a voltage signal or as a current signal.

2. Description of the Prior Art

With the aid of master oscillators, voltage or current units may be formed and then superimposed. These units are not fixed absolutely in their amplitude, but may rise or drop to certain values either applied to or produced at the key contact, so that it is possible to achieve certain effects such as "sustain", "percussion", etc. Relative thereto, reference is made to the German technical journal "Funk-Technik" (1972), No. 19, pp. 695 to 699 and No. 20, pp. 737 to 784.

Superimposing the units of certain sound groups in accordance with the organizational scheme of the electronic organ, independently of the aforementioned possibilities of achieving special effects, should moreover be without interactions upon the amplitudes up to a maximum value. These interactions occur above all when actuating the keys and are noticed as a clicking noise ("bounce"), and are due to direct voltage or direct current steps, as has been described in the German technical journal "Funk-Technik" (1972), No. 17, pp. 630 to 632.

SUMMARY OF THE INVENTION

The object of the invention is to provide a simple type of integrated circuit for effecting the linear low-interaction superposition of audio frequency electrical signals in an electronic organ.

The invention proceeds from the idea of realizing such a circuit in a I²L layout. This design principle of the "integrated injection logic (I²L)" technique—also see "Philips Technical Review", 33, No. 3 (1973), pp. 76 to 85—is also referred to as a "Merged Transistor Logic"—cf. "1972 IEEE International Solid-State Circuits Conference", Digest of Technical Papers, pp. 90 to 93. The main features of this design principle are collector regions lying on the semiconductor surface, and injectors common to a plurality of transistors and which, by forming part of a lateral transistor structure, control the current flow in the vertically operated transistors, and serve as current sources. In the equivalent circuit diagram, the injector may be shown as an equivalent circuit diagram transistor whose base is applied to emitter potential of the respective vertical transistor, and whose collector is applied to the base of this vertical transistor. Relative thereto, the collector region of the equivalent circuit diagram transistor is identical with the base region of the vertical transistor.

Accordingly, the invention relates to an integrated I²L circuit for superimposing audio-frequency electrical signals. The signals, as current units, are fed into collecting bars upon actuation of one key each of an electronic organ. With each current unit there is associated one multi-collector transistor whose first collector is connected with its base, and whose second collector is connected in accordance with the organizational scheme of the organ, with a collecting bar and to whose base terminal there is applied one of the audio-frequency signals. The multi-collector transistors of each key are arranged within the range of action of an injector system whose injector current is switched with the aid of the key. In addition to said multi-collector transistors of each of said injector system, there is provided at least one further multi-collector transistor to the base terminal of which, as connected to a first collector, there is not applied an audio-frequency signal, and whose second collector is connected to a compensating bar to which all of the second collectors of all further multi-collector transistors are contacted, and to the base terminals of which no audio-frequency signal is applied. The superimposed signals are obtained by forming the difference between the signal on the respective collecting bar and the half signal on the compensating bar.

In a preferred type of embodiment of the integrated I²L circuit according to the invention, the crosstalk of the signals within an injector system is avoided in that the injector system is subdivided into partial injectors which are connected in series with each time one collector of a multi-collector-PNP transistor to whose emitter the key current is fed.

DESCRIPTION OF THE INVENTION

Figure 1:
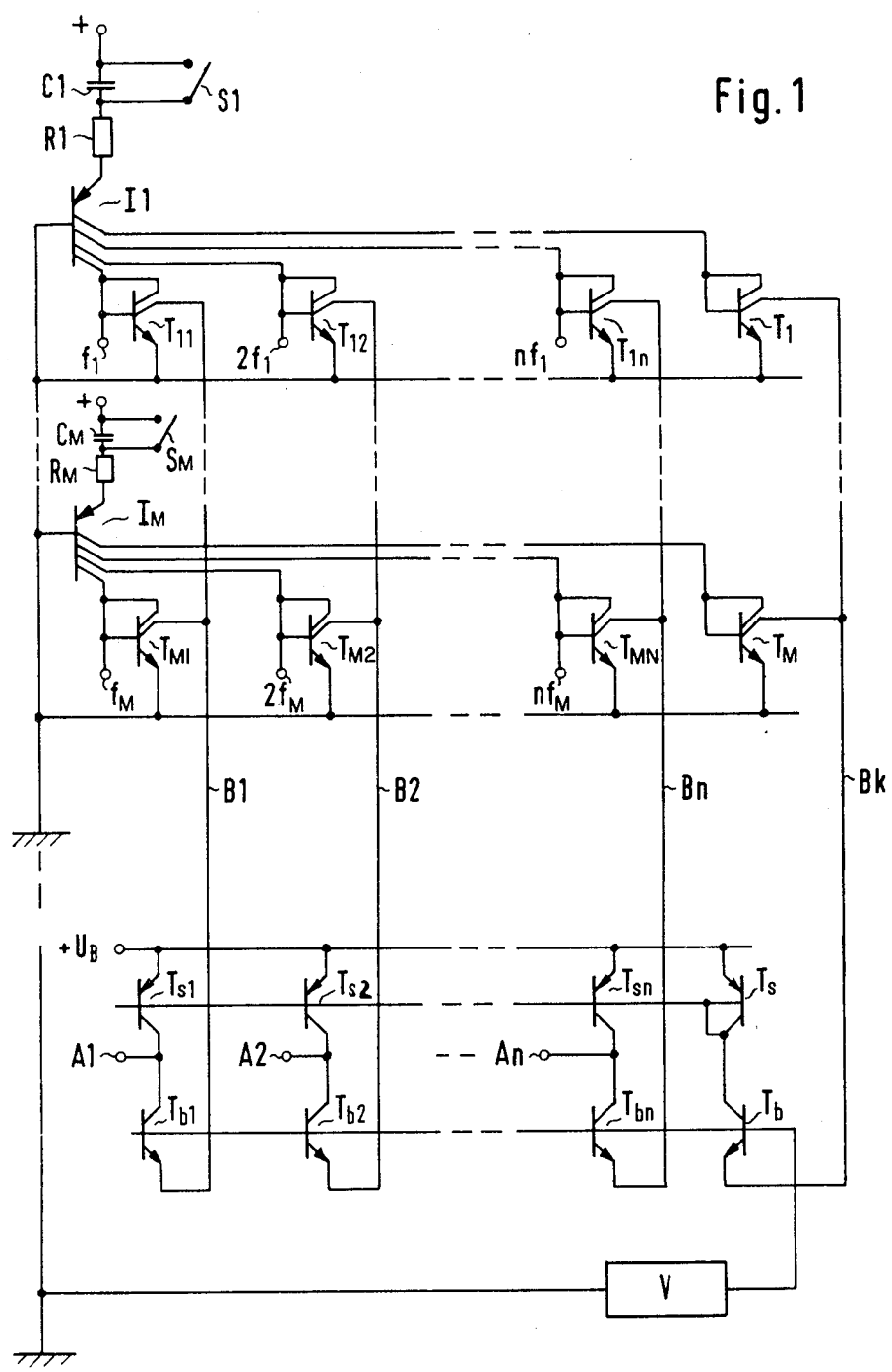
FIG. 1 is a schematic diagram of the present invention.

The invention will now be described with reference to an example of embodiment whose basic circuit diagram is shown in FIG. 1. The basic circuit diagram of FIG. 2 serves to explain the already mentioned subdivision of the injector systems into partial injectors for preventing a crosstalk of the audio frequency signals within an injector system.

Figure 2:
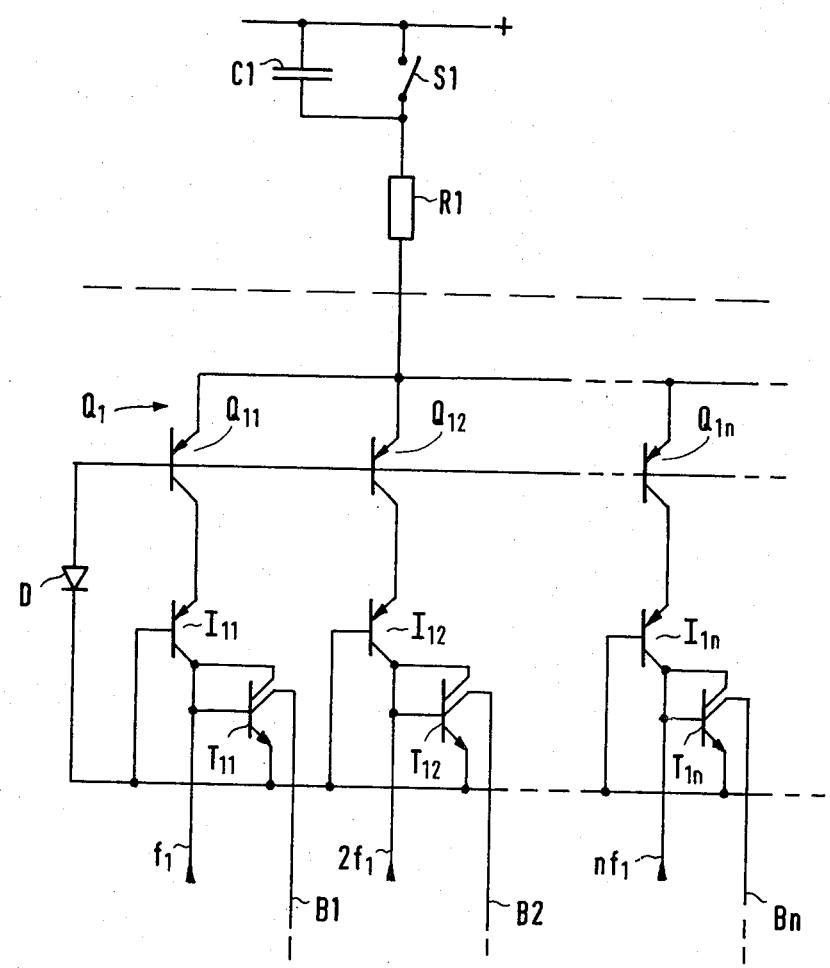
FIG. 2 is a schematic diagram of a further embodiment of the present invention.

The I²L circuit according to the invention consists on principle at first of a matrix of multi-connector transistors T11 ... Tmn, arranged in rows and columns, with the first collectors thereof being connected to the base electrodes thereof, as is shown in FIGS. 1 and 2.

The base terminals of the multi-collector transistors in each row are periodically shorted to ground, e.g. by the signals as supplied by divider chains with the corresponding audio frequencies f1 ... n.fm. In the example of embodiment according to FIG. 1 there is provided one injector I1 ... Im in common to all multi-collector transistors of one row. These injectors which, in accordance with the I²L layout, are designed as a common emitter region of each time one lateral transistor structure with each time one base region of the multi-collector transistors of each row, are switched via the key contacts S1 ... Sm to the positive pole of the supply voltage, provided that p-doped injector regions are used in the case of NPN-multi-collector transistors, which are supplied with base currents from each injector system as soon as the respective key is actuated.

The second collectors of the multi-collector transistors T11 ... Tmn are connected in a column-wise manner in accordance with the organizational scheme of the organ, to each time one collecting bar B1 ... Bn. Accordingly, one injector system is associated with each key.

According to the teaching of the invention, the multi-collector transistors of each key are now alone within the range of action of one injector system, so that when another key is actuated, the multi-collector transistors of the non-actuated key are prevented from receiving base current. This can be achieved in that the multi-collector transistors of each key are accommodated in the known manner in an insulating island surrounded by an insulating region.

Moreover, according to the invention, each of the injector systems is associated with at least one further multi-collector transistor T1 . . . Tm, which is arranged within the same insulating island as the multi-collector transistors of the same key, and to the base terminal of which, which is connected to the first collector, there is not applied an audio-frequency signal. All second collectors of these additional multi-collector transistors of each key are connected to a compensating bar Bk, as is illustrated in FIG. 1.

Accordingly, while audio-frequency current pulses appear on the collecting bars B1, B2 . . . Bn, which are in proportion to the injector currents, there will appear on the compensating bar Bk a direct current which is in a fixed ratio to the audio-frequency current pulses on the collecting bars B1 . . . Bn, hence which is likewise in proportion to the injector currents. The direct current of the compensating bar Bk is now used, in accordance with the invention, for suppressing the d.c. voltage step during the switching, in that it is superimposed upon the audio-frequency sum signal which has an inherent d.c. component, on each collecting bar in opposite polarity and with half the amplitude. For this purpose each of the superimposing signals on each collecting bar is obtained by forming the difference between the half signal on the respective compensating bar, and the signal on the collecting bar.

In order to be able to form this difference, it is proposed, in accordance with the example of embodiment of FIG. 1, to provide for each collecting bar a series arrangement including two complementary transistors Ts1, Tb1; . . . Tsn, Tbn, with the output sum signals A1, A2 . . . An being taken off at the collectors thereof which are connected to one another. In a similar way the direct current of the compensating bar Bk is likewise fed into a series arrangement of two complementary transistors Ts and Tb whose collectors are likewise connected to one another.

The emitters of the PNP-transistors of the complementary series arrangements are applied in common to the power supply $U_B$, with the collector of the PNP transistor of the series arrangement of the compensating bar Bk being connected to the base region thereof.

The collector regions of the PNP transistors designed as lateral transistors having a common base region, are connected in the example of embodiment each to one normal vertical transistor Tb1 . . . Tbn, Tb which have to be accommodated in one insulating island each, because the emitter regions as well as the collector regions must be galvanically isolated, while the base regions of the NPN transistors are applied to a potential which is common to them.

Each of the injector systems I1 . . . Im can be actuated via a key S1 . . . Sm, with these keys being arranged in series with a resistor R1 . . . Rm which is bridged by one of the capacitors C1 . . . Cm. Via such or similar RC circuits there are then achieved the already aforementioned effects such as "percussion" or "sustain".

Any crosstalk caused by the audio frequency signals of a key is reliably prevented by dividing the individual injector systems into partial injectors I11, I12 . . . I1n in accordance with the diagram shown in FIG. 2, and which are each intended to merely act upon each time one of the multi-collector transistors associated with each audio frequency signal with the frequencies f1, 2f1 . . . nf1. These partial injectors I11, I12 . . . I1n, in accordance with a further embodiment of the invention as shown in FIG. 2, are arranged in series with each time one collector of a multi-collector PNP-type transistor Q1, whose base region is provided with a biasing potential via the diode D. Both the emitters and collectors of the thus formed current source transistors Q11, Q12 . . . Q1n are designed laterally in a common base, with the collectors being individually connected to the injectors of the multi-collector transistors.

In order to make it possible for signals which are suitable for achieving certain sound effects, to be approximated to the shape of sawtooths, N multi-collector transistors having a graduated number of further collectors of same surface area and, consequently, of same currents, are used. Relative thereto, the approximation of the sawtooth is the better the greater the number N is. In order to realize the sawtooth, the nth transistor (with n = 1 . . . N) is provided with $2^{N-n}$ further collectors, in which case an audio frequency signal having the basic frequency of $f_n = f_1 \cdot 2^{n-1}$ is applied to the base region of the nth transistor. The further collectors of all multi-collector transistors are connected to a collecting bar.

Figure 3:
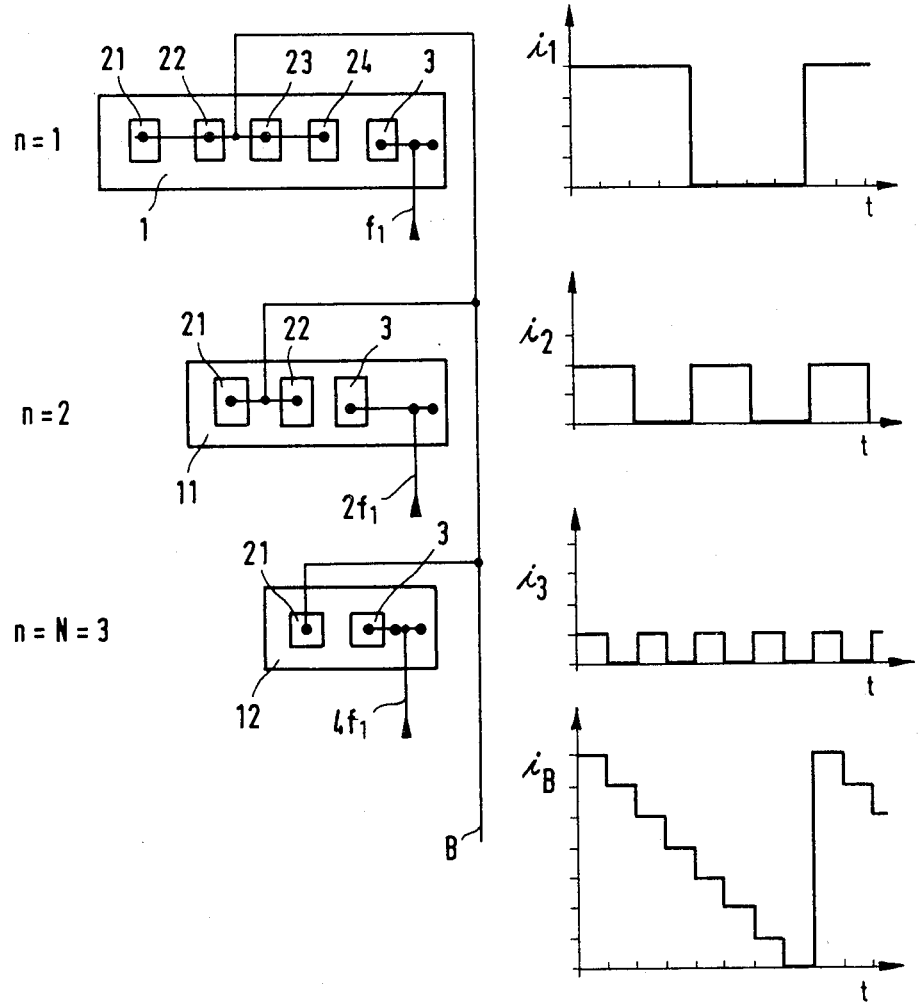
FIG. 3 is a plan view of the transistor collectors connected to a collecting bar and also illustrates the collector currents.

This principle of approximating a sawtooth as well as the respective I²L layout will now be explained schematically with reference to FIG. 3 relating to the case for N = 3. In the left-hand half of FIG. 3, there are shown in a top view three base regions 1, 11, 12 of three I²L transistors of which the first one (n = 1) comprises four further collectors 21, 22, 23 and 24, of which the second one (n = 2) comprises two further collectors 21, 22, and of which the third I²L transistor (N = N = 3) only comprises one further collector 21. The audio-frequency signals having the basic frequencies f1 (at n = 1), 2f1 (at n = 2) and 4f1 (n = 3) are applied to the base regions 1 of the I²L transistors which are connected galvanically to said first collectors 3. The further collectors are connected to one another and to the collecting bar B at which the current $i_B$ appears in a staircase-wise decreasing manner as is illustrated in FIG. 3. In the right-hand part of the drawing above the representation of the current $i_B$ there are shown schematically the sum collector currents i1, i2 and i3 of the I²L transistors shown on the left thereof, from which, by way of forming the sum, there results the current $i_B$ on the collecting bar.

The bias voltage generator V as shown in FIG. 1 between ground and the base regions of the conventionally designed vertical transistors Tb1, Tb2 . . . Tbn and Tb in which the emitter regions as well as also the collector regions as shown in FIG. 1, are separated galvanically from one another, serves the setting of the operating points of the I²L transistors.

The polarities shown in FIGS. 1 and 2 refer to the example of embodiment employing p-doped injector systems or partial injectors and NPN-type I²L transistors. Whenever the opposite conductivity type is chosen, of course, also opposite polarities will have to be applied.

What is claimed is:

1. An integrated I²L circuit for superimposing audio-frequency electrical signals in an electronic organ that has a plurality of keys and collecting bars, said circuit comprising:

a multi-collector transistor for each audio-frequency electrical signal, said transistor having a base, a first collector connected with its base and a second collector connected to a selected one of said collecting bars, said base having applied thereto one of the audio-frequency electrical signals;

an injector system associated with each key, selected ones of said multi-collector transistors being associated with each key and being arranged alone within the range of action of the associated injector system whose injector current is switched with the aid of the key;

at least one further multi-collector transistor associated with each said injector system, said further multi-collector transistor having a base connected to a first collector and a second collector connected to a compensating bar to which all of the second collectors of all further multi-collector transistors are connected; and means connected to each of said collecting bars and said compensating bar for receiving signals therefrom and in response thereto for providing said superimposed audio-frequency electrical signals by forming the differences between the signals on the respective collecting bars and half the signal on the compensating bar.

2. Integrated I²L circuit as claimed in claim 1, wherein the multi-collector-transistors are PNP type and the injector systems are subdivided into partial injectors each connected in series with one collector of the multi-collector-transistors and each partial injector has an emitter connected to the associated key.

3. Integrated I²L circuit as claimed in claim 1 wherein N multi-collector transistors are associated with each injector system and the nth one of said transistors (with n=1 to N) has $2^{N-n}$ further equal-surface collectors, and to the base region of the nth multi-collector transistor there is applied an audio-frequency signal having a basic frequency of $f_n = f_1 \cdot 2^{n-1}$ (with n=1 to N), and that the further collectors are connected in parallel with one of said collecting bars, so that sawtooths are approximated.

* * * * *